US 11,335,803 B2

United States Patent
Chuang et al.

(10) Patent No.: US 11,335,803 B2
(45) Date of Patent: May 17, 2022

(54) SOURCE-DOWN TRANSISTOR WITH VERTICAL FIELD PLATE

(71) Applicant: Diodes Incorporated, Plano, TX (US)

(72) Inventors: Chiao-Shun Chuang, Chubei (TW); Che-Yung Lin, Taipei (TW)

(*) Notice: Subject to any disclaimer, the term of this patent is extended or adjusted under 35 U.S.C. 154(b) by 0 days.

(21) Appl. No.: 16/939,198

(22) Filed: Jul. 27, 2020

(65) Prior Publication Data

US 2021/0151596 A1  May 20, 2021

Related U.S. Application Data

(60) Provisional application No. 62/935,121, filed on Nov. 14, 2019, provisional application No. 62/957,389, filed on Jan. 6, 2020.

(51) Int. Cl.
    *H01L 29/78* (2006.01)
    *H01L 29/423* (2006.01)
    *H01L 29/40* (2006.01)

(52) U.S. Cl.
    CPC ......... *H01L 29/781* (2013.01); *H01L 29/407* (2013.01); *H01L 29/4236* (2013.01); *H01L 29/7813* (2013.01)

(58) Field of Classification Search
    CPC ............ H01L 29/781; H01L 29/7813; H01L 29/4236; H01L 29/407
    See application file for complete search history.

(56) References Cited

U.S. PATENT DOCUMENTS

| 2004/0256666 A1* | 12/2004 | Fujishima | ......... H01L 29/66666 257/329 |
| 2014/0015045 A1* | 1/2014 | Su | ................... H01L 21/823487 257/334 |
| 2016/0056276 A1* | 2/2016 | Zhang | ................. H01L 29/7835 257/329 |

\* cited by examiner

*Primary Examiner* — Fernando L Toledo
*Assistant Examiner* — Valerie N Newton
(74) *Attorney, Agent, or Firm* — Yingsheng Tung; Steven A. Shaw

(57) ABSTRACT

The structure of a field-effect transistor with a source-down configuration and process of making the transistor are described in this paper. The transistor is built in a semiconductor chip with a trench extending from top chip surface towards the bottom surface. The trench contains a conductive gate material embedded in a dielectric material in the trench. A conductive field plate is also embedded in the trench and extends from the top surface of the chip towards the bottom surface of the chip and splits the conductive gate electrode into two halves. The conductive field plate penetrates the trench and makes electrical contact with the heavily doped substrate near the bottom surface of the chip.

12 Claims, 8 Drawing Sheets

SOURCE-DOWN TRANSISTOR WITH VERTICAL FIELD PLATE

BACKGROUND

Vertical MOSFET device chips are commonly configured with the gate terminal and the source terminal being accessible from the top or front side of the chip and the drain terminal from the bottom or back side of the chip. This makes it convenient if additional circuit components are needed and are built close to the front side of the chip as most traditional ICs are built. In an n-channel vertical MOSFET, for example, the drain side of the transistor includes a heavily doped n-type semiconductor substrate and an n-epi layer over the substrate. The body region and the source region of the MOSFET are built at top portion of the n-epi layer close to the top of the chip.

In certain applications, however, it would be desirable to have available a MOSFET in a source-down configuration. For example, in a modern DC-DC power converter circuits the drain of a first MOSFET may be directly connected to the source of a second MOSFET. Such a circuit would be easier to implement with a pair of MOSFETs in which the first MOSFET is source down and the second MOSFET is drain down so the bottom sides of both can be attached on a common metal pad of a lead frame or on a pc board. Two source-down MOSFET structures were disclosed previously, one by Spring in US Application 2005/0173741 and one by Jones in U.S. Pat. No. 7,456,470. Spring discloses a MOSFET cell in which the source is connected to the body region via a silicide layer at the bottom of a dedicated trench between each pair of active trenches. The Jones MOSFET is built on wafers of four epitaxial layers and the shorting of the body region to the source region is implemented also with a silicide layer, similar to the Spring structure.

SUMMARY OF THE INVENTION

The Inventors of this invention recognized that using dedicated trenches for shorting the source to the body, as proposed by Spring, necessarily enlarges chip size. Building transistors using wafer with four epitaxial layers and forming silicide deep down at the bottom of the trenches, as proposed by Spring, makes chip fabrication process complex and also taxes the manufacturing thermal budget. In addition, both structures do not leave room for the placement of field plates efficiently.

In order to overcome the above mentioned technical difficulties, the Inventors invented and disclose in this paper a novel trench MOSFET structure in which the source terminal is tied to the body region and is accessible from the bottom of the chip. Each transistor cell also includes a conductive material field plate element disposed in the cell trench. The field plate element in each cell penetrates the bottom of the trench, splits a gate material into two gate electrodes, and extends into the heavily doped substrate layer where it makes electrical connection to the source of the transistor and shorts to the body region. MOSFETs with the new cell structure show improved electric field distribution in the drift region and reduced resistance and increase blocking voltage between the drain and the source of the MOSFET.

BRIEF DESCRIPTION OF DRAWING FIGURES

The various aspects and advantages of the invention will be more easily seen through the following detailed description of preferred embodiments of the invention and through reference to the attached drawings, in which:

FIG. 2 depicts a portion of the semiconductor wafer at the start of the MOSFET fabrication. The wafer includes a heavily doped substrate under a P-EPI layer and a N-EPI layer above the N-EPI layer.

FIG. 3 depicts the wafer after the formation of the cell trenches, which may be arranged in stripe shape or cellular shape, separated by mesa regions. Successive impurity ion implants and thermal activation create a P+ region and a N+ region underneath the trenches that facilitate the electrical contact formation between the body region and the source region.

FIG. 4 depicts the wafer after the formation of the gate dielectric film and the ploy silicon gate material in the cell trenches.

FIG. 5 depicts the wafer after the formation of an oxide material filling the cell trenches.

FIG. 6 depicts the wafer after the formation of a N+ region on the top of the mesa for drain contact formation.

FIG. 7 depicts the wafer after the formation of an intermediary layer oxide (ILO), which serves as hard mask for formation of the field plate trench.

FIG. 8 depicts the wafer after the formation the first stage of the field plate trench etch. The field plate trench splits the gate material into two gate electrodes.

FIG. 9 depicts the wafer after a dielectric film is disposed in the field plate trench isolating the field plate from the gate electrodes.

FIG. 10 depicts the wafer after the formation of the field plate.

FIG. 11 depicts the wafer after an inter-metal dielectric layer (IMD) is disposed over the field plate and the interlevel oxide film.

FIG. 12 depicts the wafer after the formation of the drain terminal and the source terminal.

DEFINITION OF CERTAIN TERMS

Figure 1:
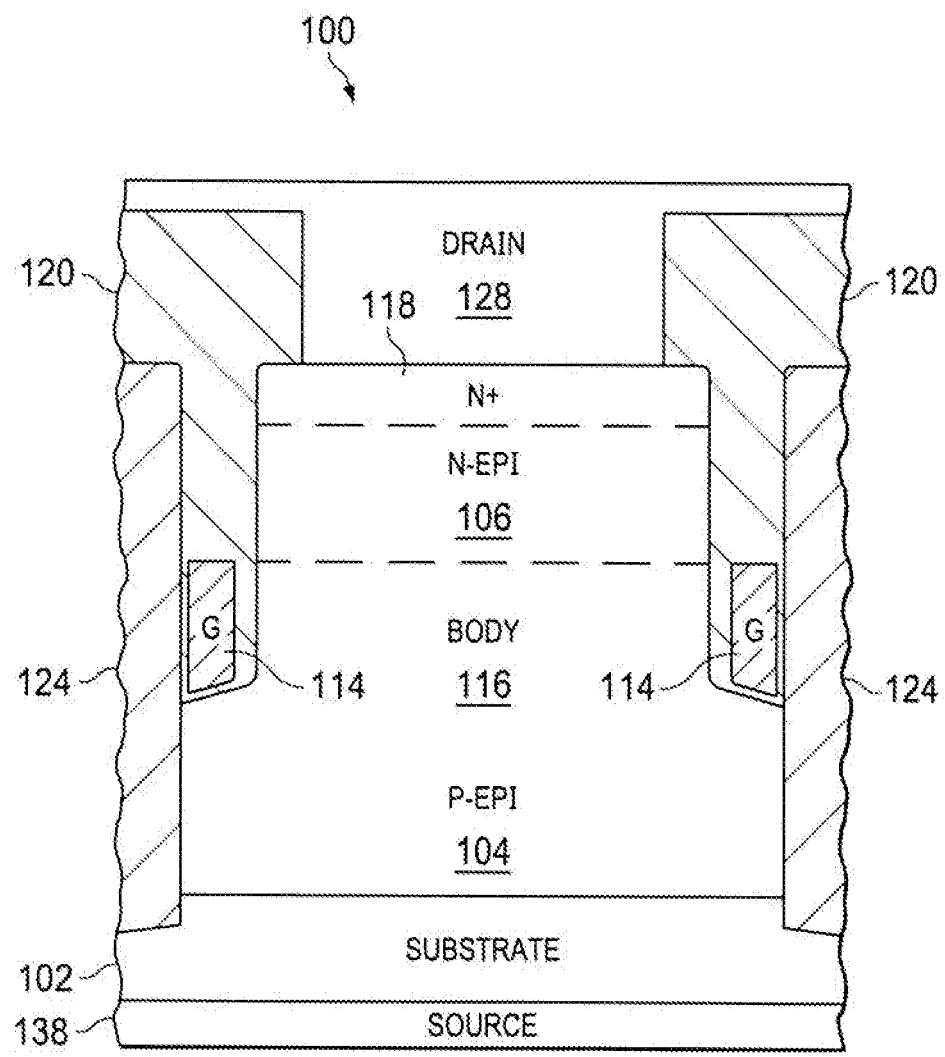
FIG. 1 depicts a cross-sectional view of a simplified cell structure of a MOSFET with its source terminal at the bottom of the transistor.

The terms used in this disclosure generally have their ordinary meanings in the art within the context of the invention. Certain terms are discussed below to provide additional guidance to the practitioners regarding the description of the invention. It will be appreciated that the same thing may be said in more than one way. Consequently, alternative language and synonyms may be used.

A semiconductor device chip in this paper refers to a slab of semiconductor material that contains an electronic component. In a discrete device, the chip may only contain a single circuit element such as a power transistor or a diode; in modern IC, a chip may contain over 10 billion circuit elements. Semiconductor material includes elements in Group IV on the periodic table, such as germanium, silicon, diamond, and compounds such as gallium arsenide, gallium nitride, silicon carbide, etc. Semiconductor chips are sawed from a finished semiconductor wafer, as such, they each have two opposite surfaces of major crystallographic planes, which are referred to in this paper as the top chip surface and the bottom surface.

A trench in this paper refers to a structure element in a device chip that is formed by etching the semiconductor wafer from area of the wafer defined by a photolithographic pattern. The etching is commonly done with reactive ions that react with the semiconductor material and form removable gases. In this paper, the trenches have depths ranging from a few micrometers to several tens of micrometers. Most drawing figures in this paper depict cross sections showing the width and the depth of the trenches. When viewed from the top surface of the chip, the trenches are usually arranged in stripes or in cellular shape. As depicted in the drawings, each trench has two opposite side walls and a flat or slightly curved bottom surface. As formed, the side walls and the bottom surface are of the semiconductor material of the wafer.

A mesa region in this paper refers to the region of semiconductor material between two trenches.

A heavily doped semiconductor substrate refers to in this paper a monolithic layer of a semiconductor material that contains a quantity of foreign elements that lowers the resistivity of the semiconductor material. For example, a heavily doped silicon substrate may contain more than $10^{18}/cm^3$ impurity ions.

Adjacent in this paper defines relative location of device structural elements. For example, a first trench is adjacent to a second trench when the two trenches are separated from each other but there is no third trench positioned between the first trench and the second trench.

Over, under, underneath, and above etc. in this paper describe the relative position of structure elements according to the drawing FIGS. 1-12 in this paper.

Impurity types in this paper refer to foreign substances introduced by design into the host semiconductor wafer to change the conductivity of the region into which the impurities are incorporated into the crystallographic lattice. For example, phosphorus and arsenic are common n-type impurity or dopant and boron and aluminum are p-type impurity or dopant when the host semiconductor is silicon.

Electrical contact in this paper defines connection between two structure elements that forms ohmic contact without an intervening element other than compounds that form inherently such as titanium silicide between silicon and titanium.

DETAIL DESCRIPTION OF PREFERRED EMBODIMENTS

FIG. 1 depicts a cross-sectional view of a MOSFET cell 100 that embodies some aspects of this invention. The relative size of the elements depicted in FIG. 1 through FIG. 12 are not true to scale for the sake of clarity. The three terminals of the MOSFET are drain terminal 128 and the source terminal 138, and the gate terminal. The drain terminal and the source terminal are depicted in FIG. 1; the gate terminal is not depicted in FIG. 1. The gate terminal, in this example, sits on top of the chip, out of the cross sectional view depicted in FIG. 1 and is electrically connected to the gate electrode structures 114. The field plate element 124 depicted here as being electrically shorted to the source via a heavily doped substrate 102. When the gate electrode 114 is biased above a threshold voltage the P-EPI region 104 near the gate electrode inverts from p-type to n-type and forms a conductive channel. When a bias voltage is applied between the drain terminal 128 and the source terminal 138, a current will flow between the two terminals.

FIG. 2 through FIG. 12 depict the MOSFET cell at various stages during the manufacturing process.

Figure 2:
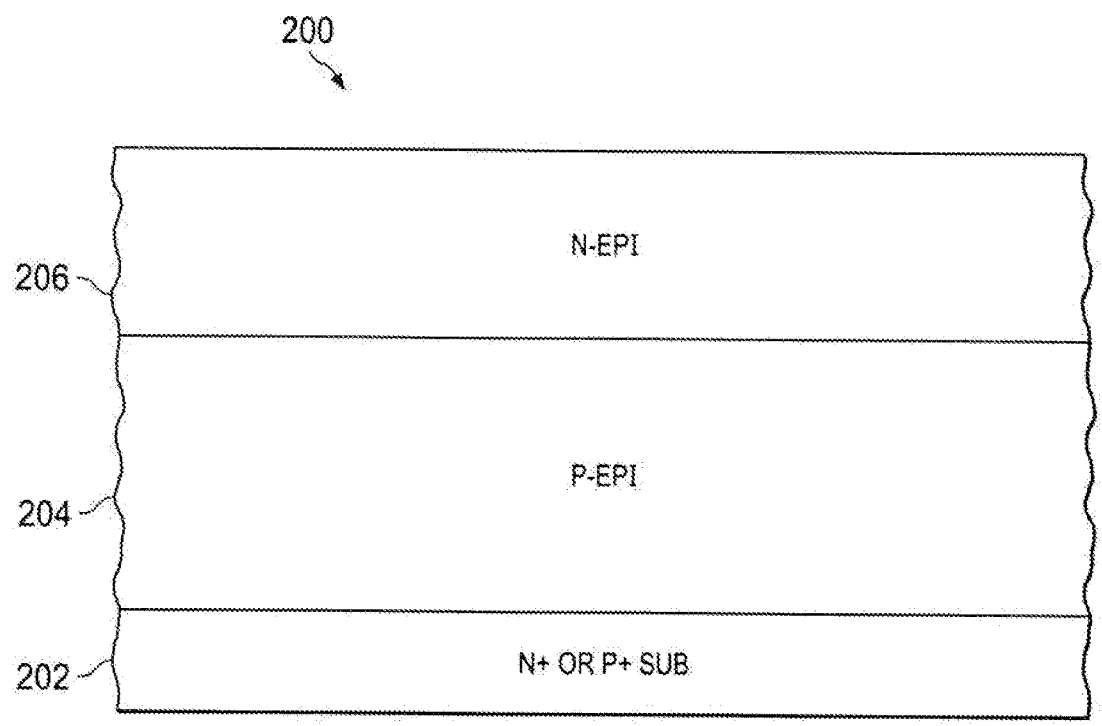
FIG. 2 through FIG. 12 depict partially completed cell structures of the MOSFET of drawing FIG. 1 at various stages of fabrication.

FIG. 2 depicts a cross-sectional view of a semiconductor wafer 200 at the start of the fabrication process. The wafer is usually a single crystal semiconductor material that is cut from a semiconductor crystal ingot. The starting wafer has a substrate layer 202 that in this example is heavily doped silicon. The dopant may be either n-type or p-type. A p-type epitaxial layer 204 and an n-type epitaxial layer 206 are grown over the substrate. In some embodiments, the N-EPI may be a converted layer from the P-EPI layer 204 by ion implant. Besides silicon, other group IV or compound semiconductor materials can also be used to practice this invention. A p-channel MOSFET can be realized by inverting the impurity polarities of various structure elements.

Figure 3:
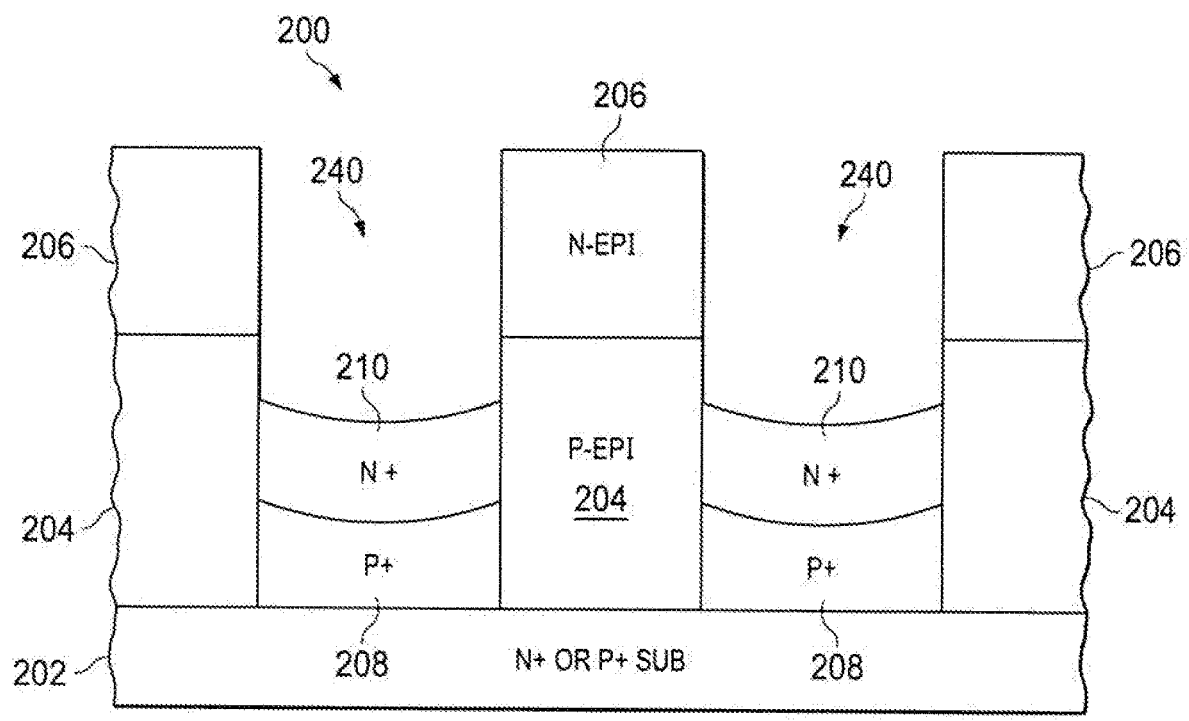

FIG. 3 depicts the MOSFET cell after trenches 240 are formed in the wafer 200. The formation of the trenches in this example involves forming a hard mask layer over the wafer 200, perform a photolithograph step to create a pattern of photoresist that exposes the areas intended for trenches to form, and removing semiconductor material by active ion etching. In FIG. 3, the trenches extend through the N-EPI layer 206 into the P-EPI layer 204. After trench etching, two consecutive ion implants are performed directed into the trenches: first with p-type impurity ions to form a p+ region 208 and then with n-type impurity ions to form an n+ region 210 over the p+ region. The p+ region 208 is connected to the P-EPI layer 204, which is the body region of the MOSFET. The implant step is followed by thermal activation, which diffuses the implanted ion into the adjacent body region.

Figure 4:
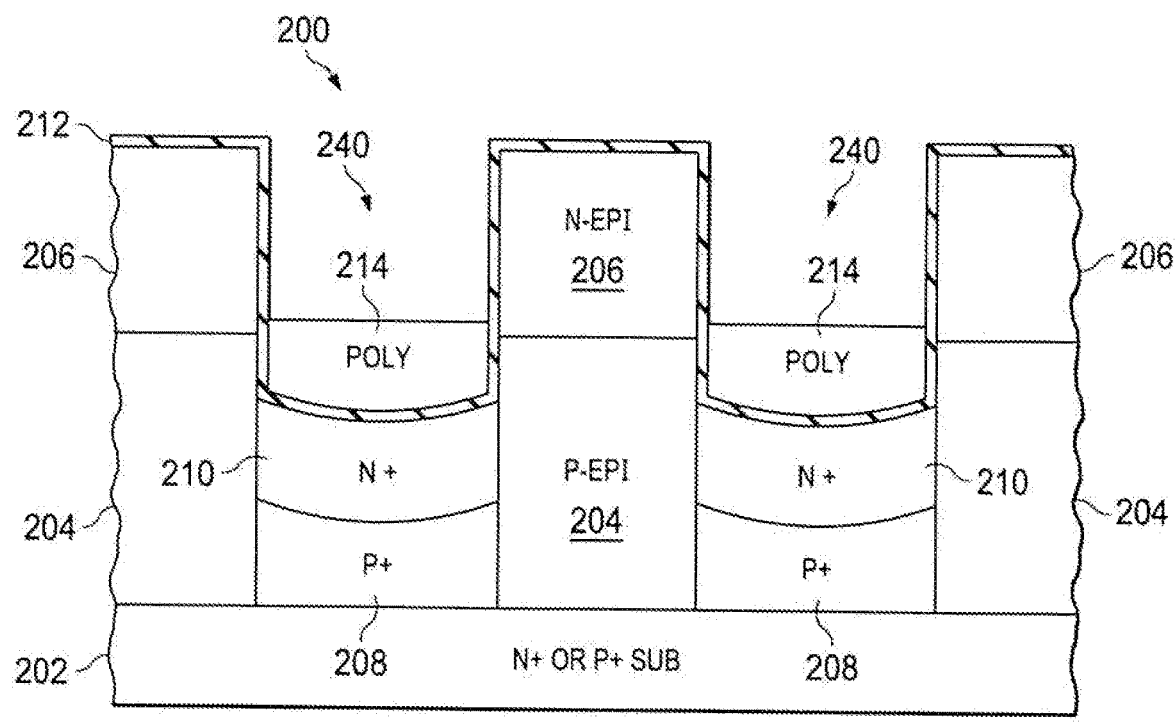

FIG. 4 depicts the cross section of the MOSFET cell after a gate dielectric film is disposed on the surface of the wafer, the bottom surface, and the side walls in the trenches 240. The gate dielectric film, in this example, is a thermally grown silicon dioxide film. Other dielectric film such as silicon oxy-nitride may also be used in addition to or in place of the thermally grown silicon dioxide film. This film may also be deposited by means such as chemical vapor deposition, especially when the wafer 200 is non-silicon. It may be desirable in some embodiments of this invention to make the bottom portion and the corner areas of the film 212 thicker in the trenches than on the side walls to lower the parasitic capacitance of the transistor.

Also depicted in FIG. 4 is a conductive material 214 such as doped CVD polysilicon in the trench 240. As deposited, the polysilicon also covers the top of the wafer 200 and the full depth of the trenches 240. As depicted in FIG. 4, the upper portion of the trench and the top surface of the wafer are free of poly silicon, which is etched away. The top surface of the remaining poly silicon inside the trenches 240 is slightly above the interface of the P-EPI region 204 and the N-EPI region 206. In this example, the remaining depth of the poly silicon section 214 is less than half of the depth of the trench 240. The section of the P-EPI 204 facing the side wall of the trench is the channel length of the transistor.

Figure 5:
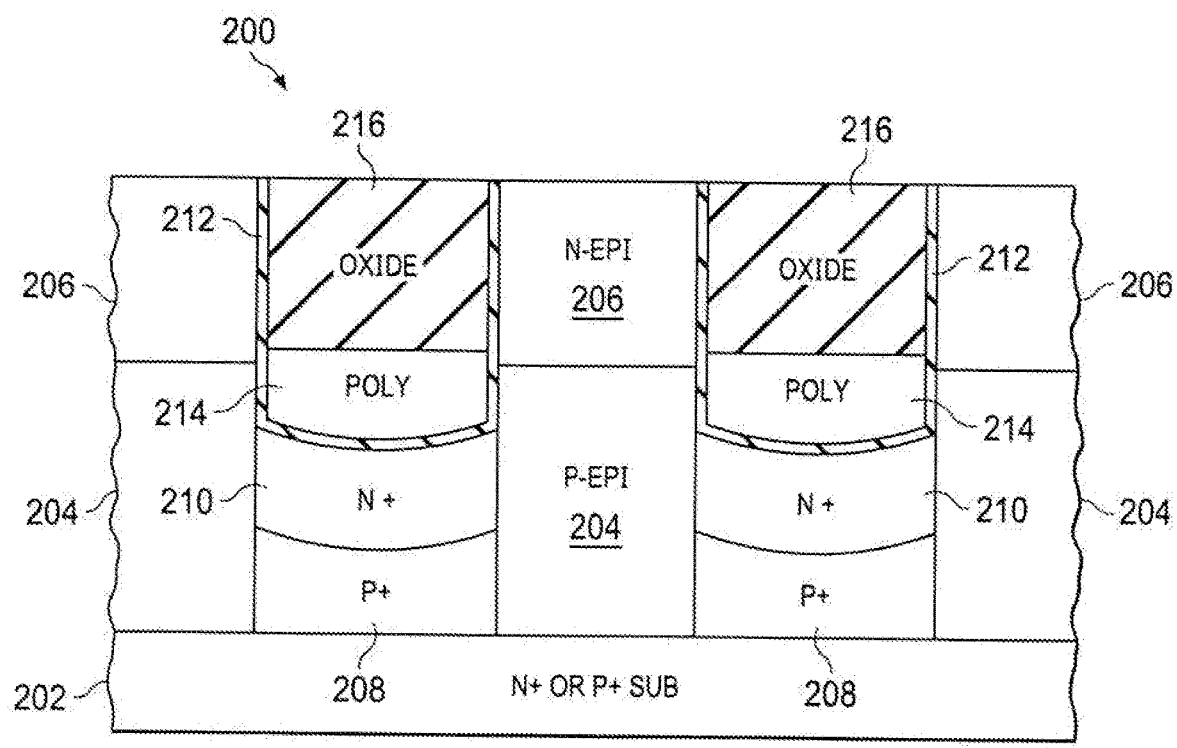

FIG. 5 depicts the wafer 200 after the vacant portion of the trenches 240 are filled with a dielectric material 216. In this example, the filling material is deposited silicon dioxide and the formation of the oxide in the trench involves a chemical vapor deposition and a film etch-back step. At the end of the etch-back, the top surface of the oxide material 216 is close to be co-planar to the top surface of the N-EPI layer 206.

Figure 6:
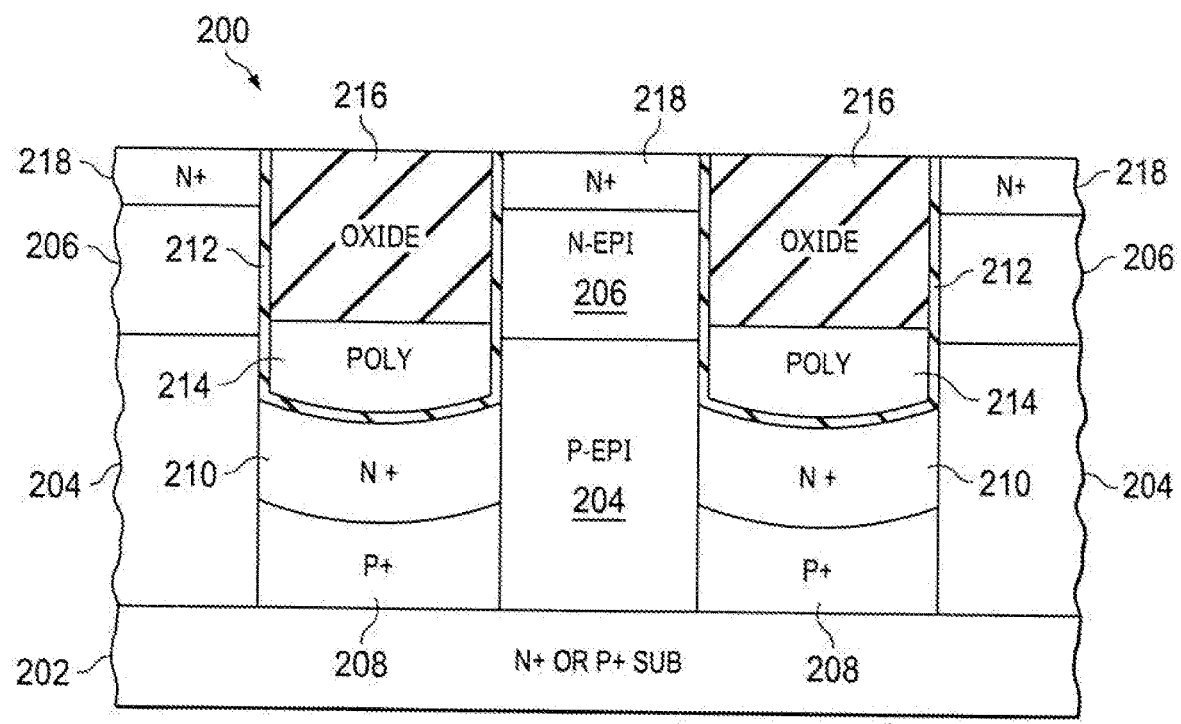

FIG. 6 depicts the wafer 200 after an N+ region 218 near the top of the wafer 200 is formed with, in this example, an n-type ion implant process. The added n-type dopant is for the formation of ohmic contact between the silicon material in the mesa adjacent to the trench 240 and the drain metal at a later stage of the process. The section of the N-EPI region 206 is the drift region in the MOSFET in this embodiment.

Figure 7:
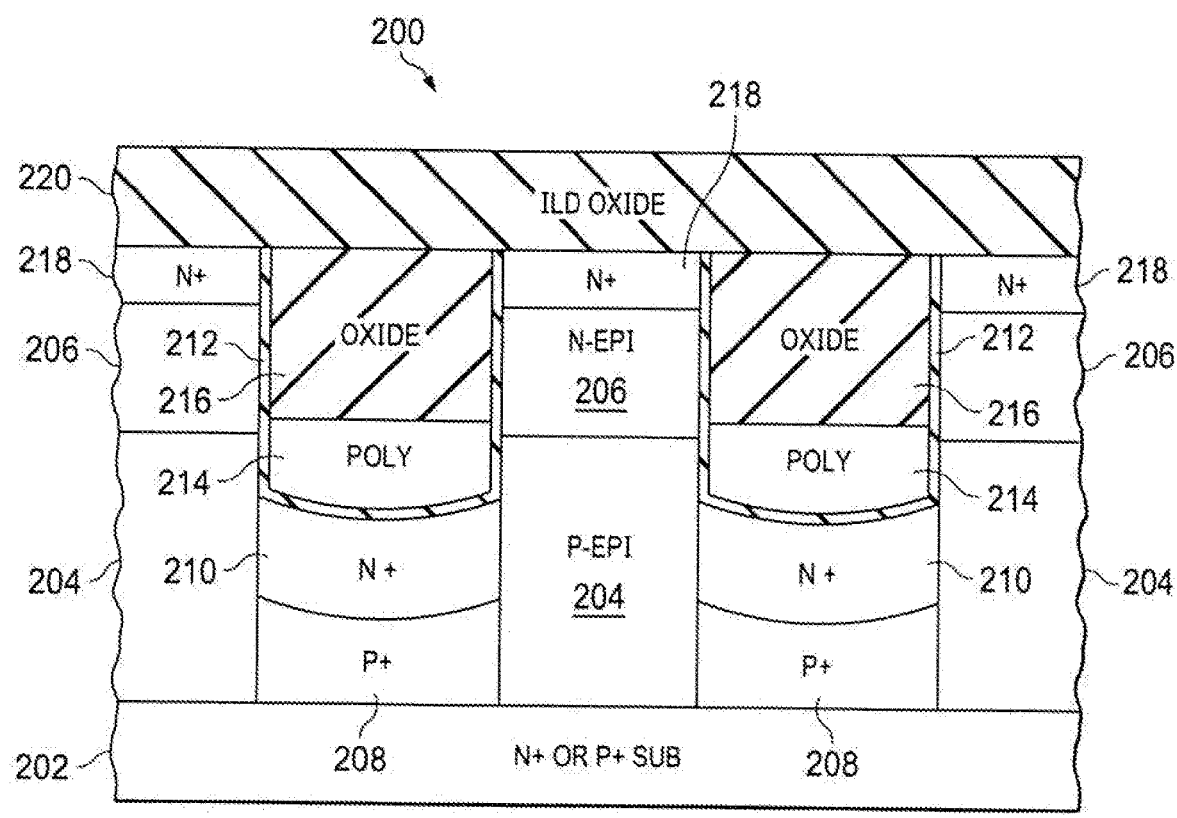

FIG. 7 depicts the wafer 200 after a layer of interlevel oxide (ILO) material 220 is deposited on the wafer surface. In this example, the ILO is a glassy oxide material that flows when heated to high temperature for providing a planarized wafer surface.

Figure 8:
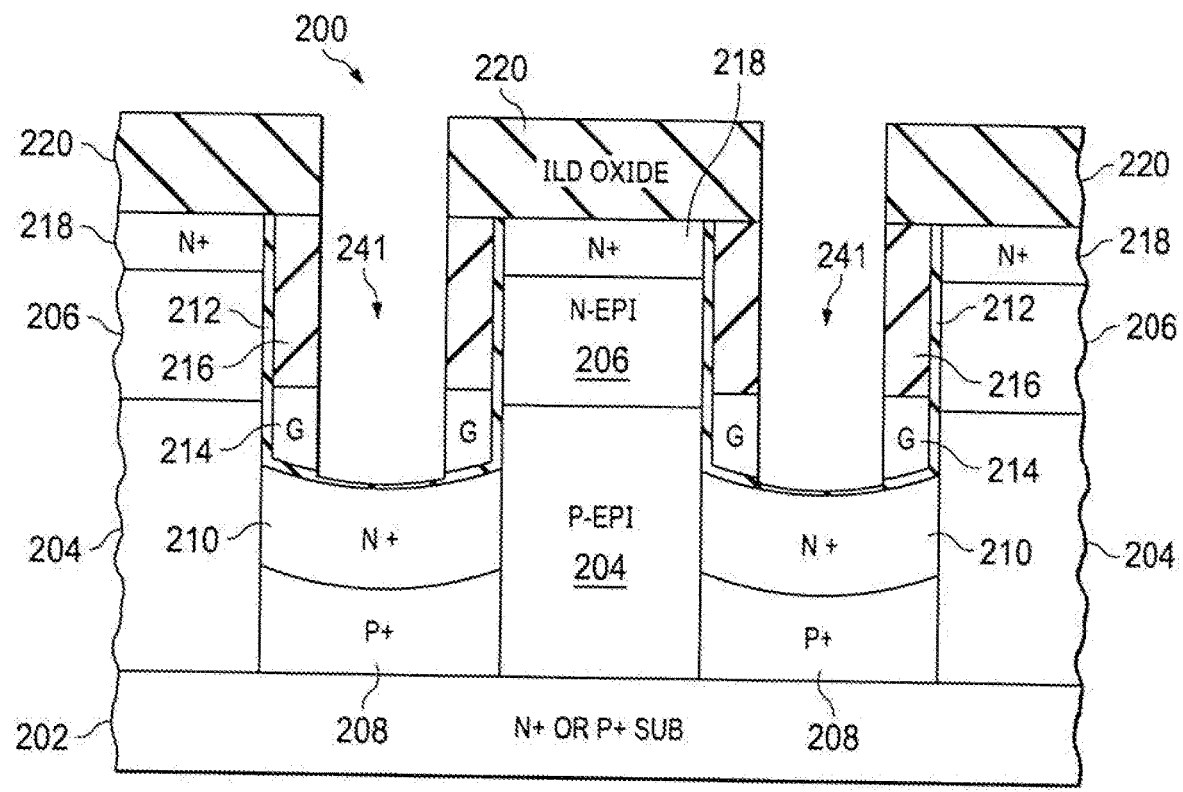

FIG. 8 depicts the wafer 200 after the first stage of the formation of field plate inside active trenches 240. A field plate trench 241 narrower than the trench 240 is formed inside it and extends from the top surface of the chip to the bottom of the trench 240, and at its bottom the trench 241 splits the poly silicon material into two separate gate electrodes 214.

Figure 9:
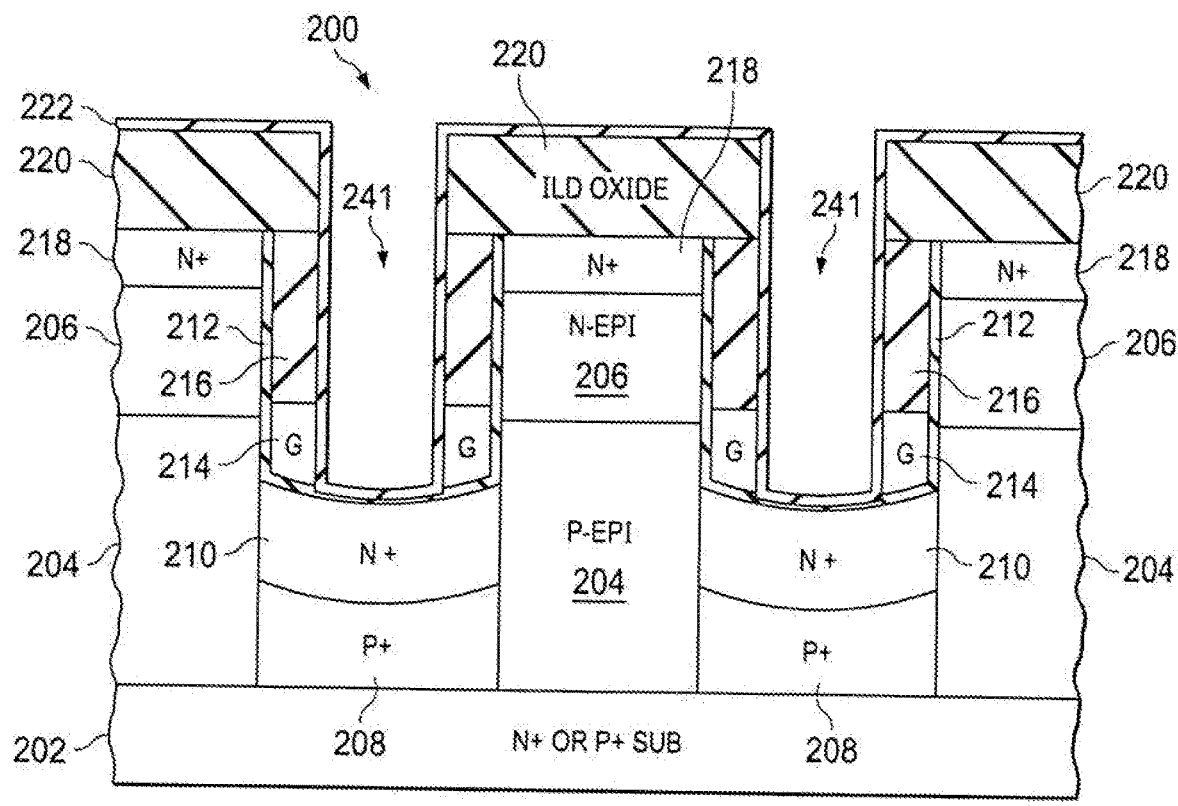

FIG. 9 depicts the wafer 200 after a dielectric film 222 is disposed to cover the inside walls of the field plate trench 241 along with it bottom surface and the top chip surface. The film isolates the gate electrode 214 from the field plate that will be formed inside the field plate trench 241 at a later process step.

Figure 10:
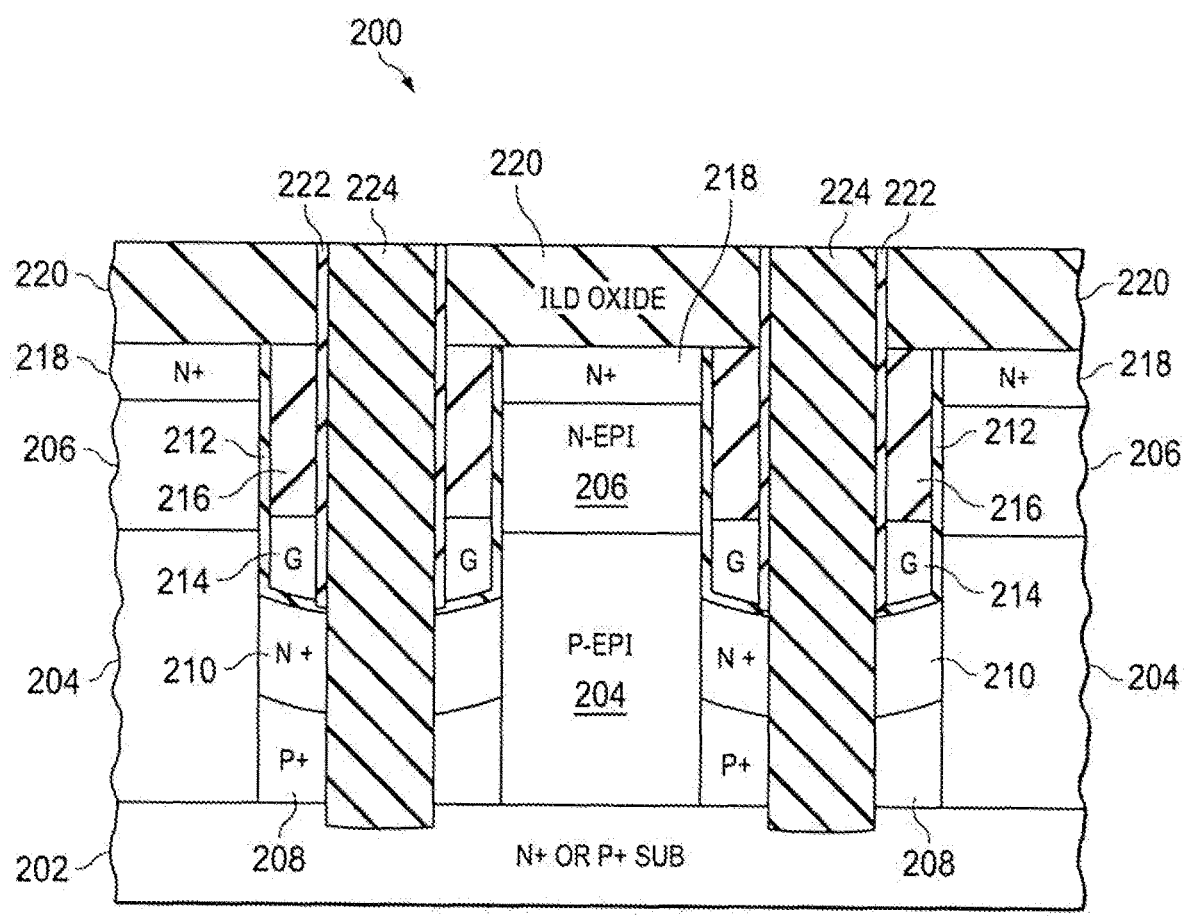

FIG. 10 depicts the wafer 200 after the formation of the field plate electrode 224. The formation of the field plate electrode 224 comprises first a further extension of the field plate trench 241 through the N+ region 210 and the P+ region 208 into the substrate 202. The extended field plate trench 241 is then filled with a conductive material 224 such as tungsten or doped poly silicon, which makes contact to the N+region 210, the P+ region 208, and the substrate 202. The formation of the field plate, in this example, comprises deposition of tungsten over the wafer surface and into the field plate trench and removing the tungsten from the surface of the top surface of the wafer.

Figure 11:
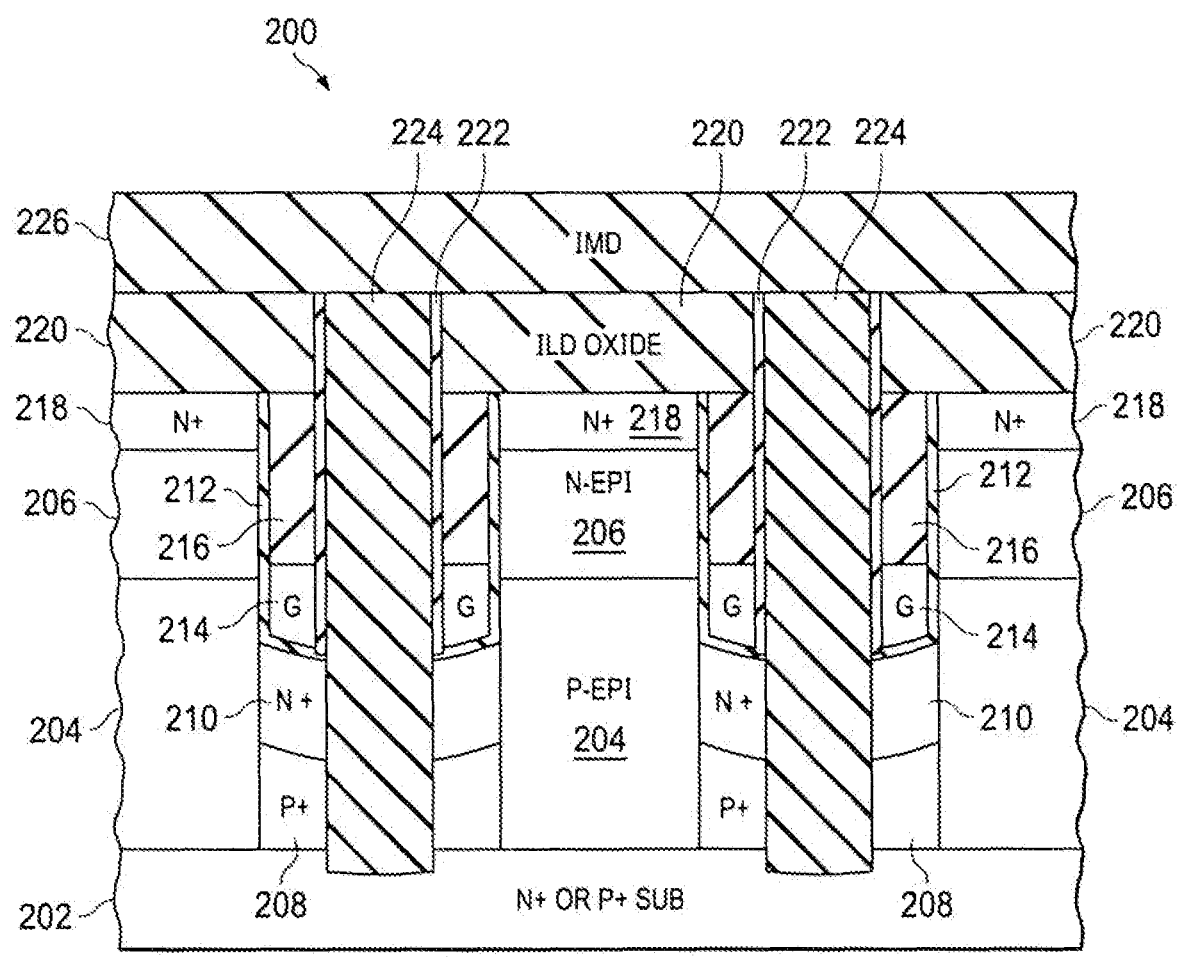

FIG. 11 depicts the wafer 200 after another layer of inter-metal dielectric (IMD) film 226 such as silicon dioxide is deposited on the wafer. In this example, the IMD film 226 is a second glassy silicon dioxide film.

Figure 12:
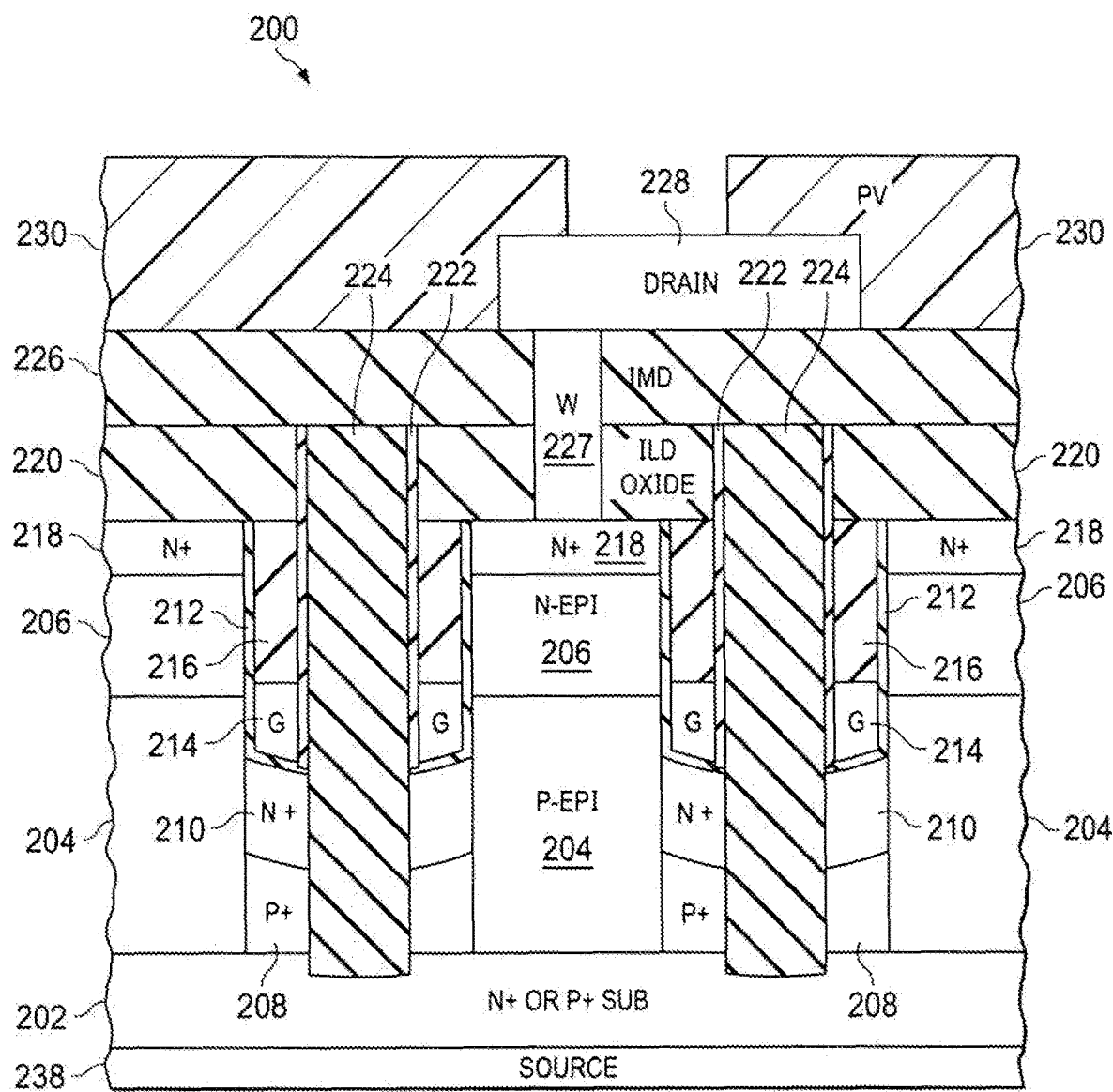

FIG. 12 depicts the wafer 200 after the drain terminal 228 and the source terminal 238 are formed. The source terminal 238 in this example comprises a layer of metal such as nickel, gold, or their combination at the back surface of the wafer. The metal 228 makes ohmic contact to the heavily doped substrate 202. The drain metal 224, such as aluminum, tungsten, titanium, gold, or their combination makes ohmic contact to the N+ region 218 through a metal plug 227, comprises, for example, tungsten through the IMD film 226 and the ILD film 220.

We claim:

1. A semiconductor device chip having a top chip surface and a bottom chip surface, the semiconductor device chip comprising:
    a first trench having trench sidewalls and a trench bottom surface, the first trench extending from the top chip surface towards the bottom chip surface;
    a conductive field plate in the trench, extending from the top surface of the chip towards the bottom surface of the chip, penetrating the trench bottom surface and splitting a conductive material into two gate electrodes, which are electrically isolated from the field plate;
    the conductive field plate contacting a heavily doped semiconductor substrate near the bottom chip surface; and
    a doped region adjacent to and at least co-extensive laterally to the entire bottom surface of the first trench, doped with an impurity same as in the substrate.

2. The semiconductor device chip of claim 1, further comprising a second trench adjacent to the first trench, separated from the first trench by a mesa region of semiconductor material.

3. The semiconductor device chip of claim 2, in which each of the two gate electrodes is separated from the field plate by a dielectric film.

4. The semiconductor device chip of claim 3, in which the gate electrodes face a body region in the mesa on each side of the trench.

5. The semiconductor, device chip of claim 4, in which the body region is doped with an impurity of a first type.

6. The semiconductor device chip of claim 5, further comprising a top doped region over a bottom doped region stacked underneath the trench bottom surface;
    the top doped region doped with impurity of a second type opposite the first type, the bottom doped region doped with impurity of the first type.

7. The semiconductor device chip of claim 6, further comprising a source region, which comprises the substrate and the top doped region.

8. The semiconductor device chip of claim 7, in which the field plate electrode is electrically contacted to the source region and the body region.

9. The semiconductor device chip of claim 7 in which the source region and the substrate are of the same dopant type.

10. The semiconductor device chip of claim 7 in which the source region and the substrate are of the opposite doping type.

11. The semiconductor device chip of claim 3 further comprising a section of dielectric material in the first trench over the gate electrodes.

12. The semiconductor device chip of claim 9, in which the dielectric material occupies a section of the first trench that is longer than the section occupied by the gate electrodes.

* * * * *